United States Patent

Li et al.

[11] Patent Number: 6,011,737
[45] Date of Patent: *Jan. 4, 2000

[54] DRAM WITH EDGE SENSE AMPLIFIERS WHICH ARE ACTIVATED ALONG WITH SENSE AMPLIFIERS INTERNAL TO THE ARRAY DURING A READ CYCLE

[75] Inventors: Li-Chun Li, Los Gatos; Lawrence C. Liu, Menlo Park, both of Calif.; Michael A. Murray, Bellevue, Wash.

[73] Assignee: Mosel Vitelic Corporation, San Jose, Calif.

[*] Notice: This patent is subject to a terminal disclaimer.

[21] Appl. No.: 08/967,436

[22] Filed: Nov. 11, 1997

Related U.S. Application Data

[63] Continuation of application No. 08/760,124, Dec. 3, 1996, Pat. No. 5,757,710.

[51] Int. Cl.⁷ .................................................. G11C 7/00
[52] U.S. Cl. .......................................... 365/207; 365/195
[58] Field of Search ............................. 365/207, 230.03, 365/208, 205, 195

[56] References Cited

U.S. PATENT DOCUMENTS

| | | | |
|---|---|---|---|
| 5,214,600 | 5/1993 | Cho et al. | 365/207 |
| 5,383,159 | 1/1995 | Kubota | 365/207 |
| 5,444,305 | 8/1995 | Matsui | 365/207 |
| 5,757,710 | 5/1998 | Li et al. | 365/207 |

*Primary Examiner*—Tan T. Nguyen
*Attorney, Agent, or Firm*—Skjerven Morrill MacPherson Franklin & Friel LLP; Barmak S. Sani

[57] ABSTRACT

A staggered bitline sense amplifier architecture utilizes a circuit to simulate the effect of a memory cell on each of the edge sense amplifiers not selected for connection to an activated memory cell, thereby to allow the edge sense amplifiers to be activated simultaneously with the sense amplifiers internal to the memory array without the danger of burning out the edge sense amplifiers. This structure eliminates the address decoding circuitry commonly associated with the edge sense amplifiers used in staggered shared bitline sense amplifier architectures, thereby decreasing the complexity and reducing the chip size of such memory arrays.

7 Claims, 6 Drawing Sheets

DRAM WITH EDGE SENSE AMPLIFIERS WHICH ARE ACTIVATED ALONG WITH SENSE AMPLIFIERS INTERNAL TO THE ARRAY DURING A READ CYCLE

This application is a continuation of application Ser. No. 08/760,124, filed Dec. 3, 1996 now U.S. Pat. No. 5,757,710.

FIELD OF THE INVENTION

This invention relates to dynamic random access memories (DRAMs) and in particular to a DRAM utilizing a staggered bit line sense amplifier architecture containing sense amplifiers between memory arrays and sense amplifiers associated solely with the end memory arrays which eliminates the need for selective activation of the sense amplifiers associated with the end memory arrays.

DESCRIPTION OF PRIOR ART

One type of DRAM, as shown in FIG. 1, utilizes an even number (such as two, or four and so on) of blocks of memory cells (shown as two blocks A and B) with sense amplifiers 13-1 to 13-3 being arranged between a pair of memory blocks A, B so as to be capable of sensing the state of a memory cell being read out in either one block or the other block, as required. At any given time, each sense amp 13-i is capable of sensing the state of a memory cell in either block 11 or block 12. To do this, the system turns on selection transistors connected between the bit line pairs 11-i or 12-i in the particular block 11 or 12, respectively, containing the memory cell being sensed and the sense amplifier 13-i, where i is a selected integer such as 1, 2 or 3.

Another DRAM configuration, shown in FIG. 4, utilizes what is known as a staggered bit line sense amplifier architecture. In this configuration, the sense amplifiers (shown as 43-1, 43-2, 44-1, 44-2, 45-1 and 45-2), rather than all being arranged between pairs of blocks of memory 41, 42 (only two blocks of memory cells 41 and 42 are shown in FIG. 4) are arranged in a staggered configuration. Sense amplifiers 43-1 and 43-2 (known as "end" or "edge" sense amplifiers) are located on the left side (or "edge") of the first array or block 41 of memory cells and sense amplifiers 44-1 and 44-2 which work with both memory blocks 41 and 42 are located between memory blocks 41 and 42. Sense amplifiers 44-1 and 44-2 are connected to corresponding pairs of bit lines (bit line pairs 402A and 402B and bit line pairs 404A and 404B, respectively) from both memory blocks 41 and 42. The second memory block 42 also has half of its memory cells connected by bit line pairs (shown, for example, as 401C and 403C) to "end" or "edge" sense amplifiers 45-1 and 45-2 along the right side of memory block 42.

Four rows 401, 402, 403 and 404 of bit line pairs are shown in FIG. 4. The first row of bit lines 401 includes an end-cap pair of bitlines 401A and bit line pair 401B in the first memory array 41 connected to left edge sense amp 43-1 located to the left of memory array 41, and an end-cap pair of bitlines 401D and bit line pair 401C in the second memory array 42 connected to right edge sense amp 45-1 located to the right of memory array 42. In row 402, the pair of bit lines 402A in the first memory array 41 and the second pair of bit lines 402B in the second memory array 42 utilize sense amp 44-1 located on the right side of the first memory array 41 and on the left side of the second memory array 42. The bit line pairs 403A, 403B, 403C and 403D in the third row 403 of bit line pairs are connected into left edge sense amp 43-2 and right edge sense amp 45-2 as shown. The fourth row 404 of bit line pairs (shown as 404A and 404B) are connected to sense amp 44-2 located between bit line pair 404A in the first memory array 41 and bit line pair 404B in the second memory array 42.

Select transistors (not shown) connect the sense amps 44-1 and 44-2 located between memory arrays 41 and 42 to the bit line pairs in rows 402 and 404 which in turn are connected to memory cells in the memory block 41 or 42 which contains the particular memory cell which is being read by the sense amp. The word line (not shown in FIG. 4) which activates the memory cell being read in one of the memory blocks 41, 42 also activates all the other memory cells in the memory block in the same column as the memory cell being read. Thus the sense amplifiers connected by bit line pairs to these memory cells are activated to read out these memory cells. However, only the output signal of the sense amplifier connected to the memory cell being read is transferred to the output pin (not shown) of the memory 40. The left edge sense amps 43-1 and 43-2 and the right edge sense amps 45-1 and 45-2 however are each connected to only one bit line pair from a memory block. One of the edge sense amps 43-1, 43-2, 45-1 and 45-2 must be selected to be read out by decoding circuitry at the appropriate time when the data to be read out is located in a memory cell connected to the bit line pair connected to this edge sense amp.

In addition, the edge sense amps 43-1, 43-2, 45-1 and 45-2 must be deselected when a selected memory cell is to be read out by a sense amp 44-i (i=1 or 2) located between the two memory arrays 41, 42.

FIG. 2 shows a typical sense amplifier used in accordance with the structure of FIGS. 1 and 4. To activate the sense amp, the sense amp receives two signals, signal SLP, a positive pull-up voltage, and signal SLN, a pull down or reference voltage. When the signal SLP on line 14 goes high and the signal SLN on line 15 goes low, the sense amplifier made up of P channel transistors P1 and P2 and N channel transistors Q1 and Q2 is activated. The bit lines $\overline{BL}$ and BL are connected to nodes C and D, respectively, of the sense amplifier. Node C is connected to the drain of P channel transistor P1 and the drain of N channel transistor Q1 and node D is connected to the drain of P channel transistor P2 and the drain of N channel transistor Q2. The gate of P channel transistor P2 is connected to node C and to the gate of N channel transistor Q2, while the gate of P channel transistor P1 is connected to node D and the gate of N channel transistor Q1. If the signal on bitline BL is higher than the signal on bit line $\overline{BL}$, then when signals SLP and SLN go high and low, respectively, an imbalance is formed between the currents flowing through two parallel paths of the sense amplifier, namely the path made up by series connected transistors P1 and Q1 and the path made up by series connected transistors P2 and Q2. A higher signal on node D than on node C turns on transistor Q1 more strongly than transistor Q2. Thus, the voltage drop across transistor P1 is larger than the voltage drop across transistor P2, thus causing the voltage on node C to be lower than the voltage on node D. Transistor Q2 is thus gradually turned off, thereby causing the sense amplifier to go to a state where node C is essentially at the voltage of the SLN signal on line 15, while node D is pulled up to essentially the voltage SLP on line 14. Should, however, the voltages on nodes C and D be equal when SLP goes high and SLN goes low, then current will flow through both the arm made up of transistors P1 and Q1 and the arm made up of transistors P2 and Q2 of the sense amp. Such current can, in some instances, burn out these two arms and either destroy or degrade the performance of the sense amp.

The signals on nodes C and D of the sense amp are read out by turning on select transistors Q3 and Q4. Select transistor Q3 allows the signal on node D to pass to output data bus DB, while select transistor Q4 allows the signal on node C to pass to data bus $\overline{DB}$. Transistors Q3 and Q4 are turned on by a signal from the Y decoder, which selects the particular sense amp to be read out from the memory array in response to address signals input to the memory array.

FIG. 3 illustrates two memory cells 30-1 and 30-2 within the memory array connected by bitline BL and bitline $\overline{BL}$, respectively, to the sense amp shown in FIG. 2. In FIG. 3, a memory cell, such as memory cell 30-1 or memory cell 30-2, is made up of a pass transistor Q and a storage capacitor C. The memory cell to be read out is selected by a signal on the word line WL which controls the particular memory cell 30-1 or 30-2 to be read out. For example, if memory cell 30-1 is to be read out, the signal on word line WL-1 goes high. This high signal turns on pass transistor Q in memory cell 30-1, thereby causing the charge stored on capacitor C to change the voltage on the bitline BL. Prior to the word line WL-1 going high, several preparatory operations have taken place. First, the complement of the row address strobe signal ($\overline{RAS}$) goes low, indicating that a read operation is about to take place. The signal EQ has been high, turning on transistors Q9, Q7, and Q8, thereby equalizing the voltages on bitline BL and bitline $\overline{BL}$ to the voltage $V_{bp}$ which is typically one-half the supply voltage VDD. The transistors Q7 and Q8, when turned on by EQ high, apply the voltage $V_{bp}$ directly to both the lines BL and $\overline{BL}$. Transistor Q9, when on, as it is when EQ is high, equalizes the voltages on these two lines. If the signal stored in memory cell 30-1 is to be read out, then the signal EQ is selected and goes low, thereby turning off transistors Q7, Q8, and Q9 and thus allowing the voltage on BL to take the particular value associated with the signal stored on memory cell 30-1 being read out.

The signal TG is applied to gates of pass transistors Q5 and Q6. Transistors Q5 and Q6, when turned on, pass the voltages on bitline BL and bitline $\overline{BL}$ to nodes D and C, respectively, of the sense amp 20 shown in FIG. 2. If the particular bitline pair, made up of lines BL and $\overline{BL}$ shown in FIG. 3, is selected, the signal TG remains high, thereby leaving on transistors Q5 and Q6. If this bitline pair were not to be selected, then the signal TG would go low, isolating this bitline pair from its corresponding sense amplifier. After these operations, the voltage on the particular word line, in this case WL-1 associated with the memory cell 30-1 to be read out, goes high, thereby turning on pass transistor Q. The charge stored on capacitor C in cell 30-1 then causes the voltage on bitline BL to either go high or low relative to the voltage on bitline $\overline{BL}$, thereby causing an unbalance in voltage to be applied to nodes C and D in the sense amplifier 20 shown in FIG. 2. This unbalance insures that sense amplifier 20 will swing to one or the other state representing either a binary 0 or a binary 1 and not hang up due to nodes C and D being at equal voltage. When the sense amp hangs up, the sense amp passes a large current which potentially damages or destroys the sense amp.

As shown in FIG. 4, the left edge sense amplifiers 43-1 and 43-2 are selected to receive the signals SLN and SLP by the address <A>. The right edge sense amplifiers 45-1 and 45-2 are selected to receive the signals SLN and SLP by the address <B>. The necessity of insuring that the signals SLN and SLP are not applied to the edge sense amplifiers unless the edge sense amplifiers are selected to be read out adds complexity and cost to the circuit. Accordingly, it would be desirable to eliminate this decoding circuitry from a memory array using the staggered shared bitline sense amplifier architecture.

SUMMARY OF THE INVENTION

In accordance with this invention, a staggered shared bitline sense amplifier architecture is provided which eliminates the need for the special decoding circuitry to selectively activate the edge sense amplifiers not selected for connected to an activated memory cell. In accordance with this invention, circuitry is provided wherein prior to the activation of all the sense amplifiers, an unbalanced signal corresponding to the signal that would be associated with an activated memory cell storing a selected charge (in one embodiment, zero charge) is applied to each of the edge sense amplifiers not selected for connection to an activated memory cell. By applying a voltage unbalance to the edge sense amplifiers not selected for connection to an activated memory cell, edge sense amplifiers can be activated simultaneously with the sense amplifiers located between memory blocks, thereby eliminating the need for the special decoding circuitry to separately activate the edge sense amplifiers not selected for connection to an activated memory cell.

In accordance with this invention, a separate circuit is connected to one of the bitlines in an end-cap bitline pair connected to each edge sense amplifier. Prior to activating all sense amplifiers, this separate circuit is activated to insure a voltage unbalance across each end-cap bitline pair made up of bitline BL (end-cap) and bitline $\overline{BL}$ (end-cap) connected to each of the edge sense amplifiers. This voltage unbalance simulates an actual voltage difference across a bitline pair caused by reading out a memory cell. In one embodiment, the memory cell has a storage capacitor with zero charge on it. Consequently, each of the edge sense amplifiers connected to a corresponding end-cap bitline but not selected for connection to an activated memory cell pair behaves as though a memory cell storing a zero charge had been connected to that edge sense amplifier. These edge sense amplifiers then go to a state corresponding to such charge. This avoids burning out these edge sense amplifiers by preventing the edge sense amplifiers from hanging up at a midpoint and going to neither a high nor low state when activated.

One advantage of this invention is that the decoders required for selectively activating the edge sense amplifiers are no longer required, thereby saving space and resulting in a smaller memory chip with less complex circuitry.

This invention will be more fully understood in accordance with the following detailed description taken together with the drawings.

DETAILED DESCRIPTION

While one embodiment of this invention will be described, other embodiments of this invention will be obvious in view of this description, which is illustrative only and not limiting.

Figure 4:
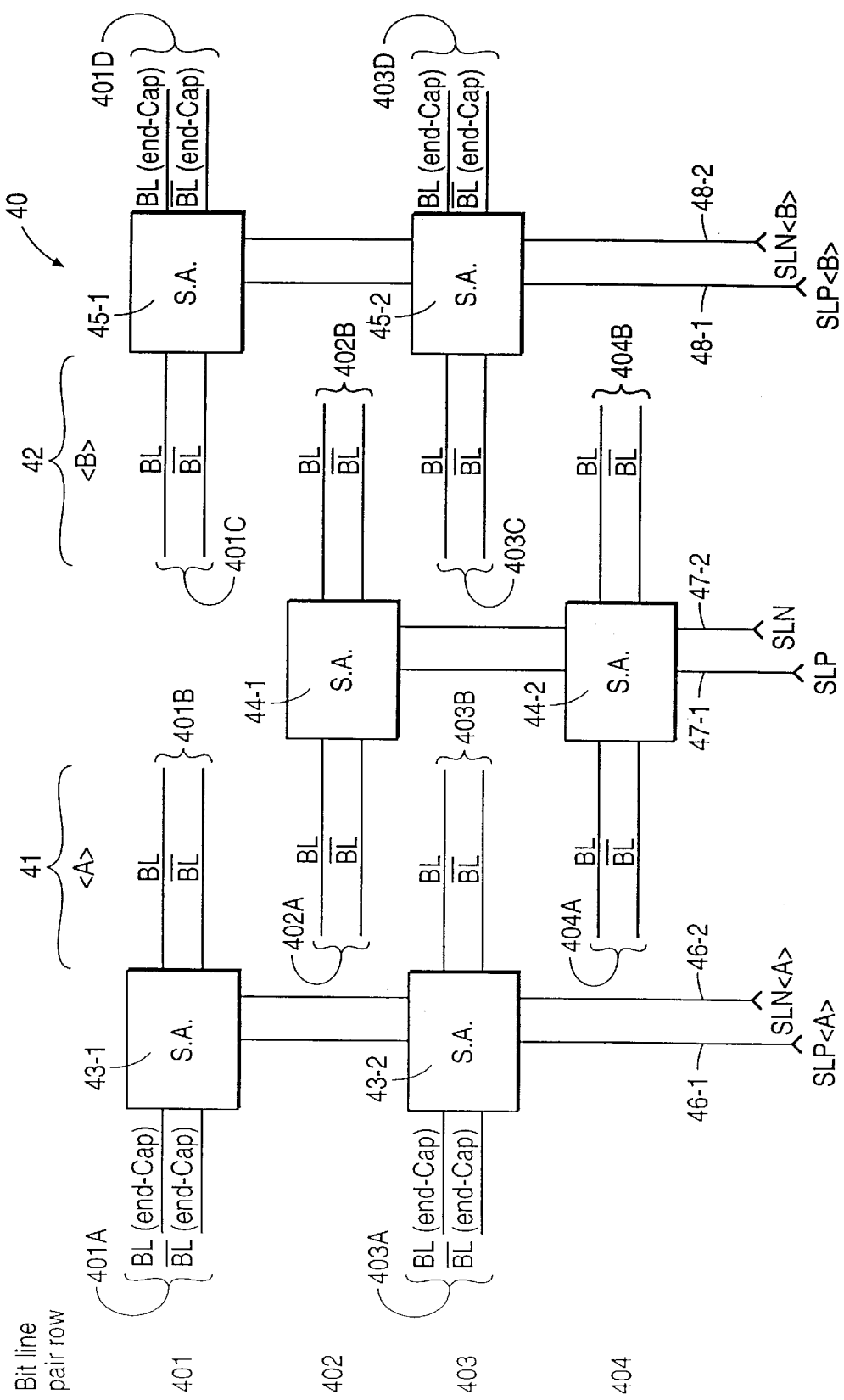
FIG. 4 shows a staggered shared bitline sense amplifier architecture using edge sense amplifiers 43-1, 43-2 and 45-1, and 45-2 connected to memory blocks 41 and 42, respectively, and internal sense amplifiers 44-1, 44-2 connected to two blocks of memory 41, 42 with separate decoding structure required for selectively activating the left edge sense amplifiers 43-1 and 43-2 and the right edge sense amplifiers 45-1 and 45-2.
Figure 5:
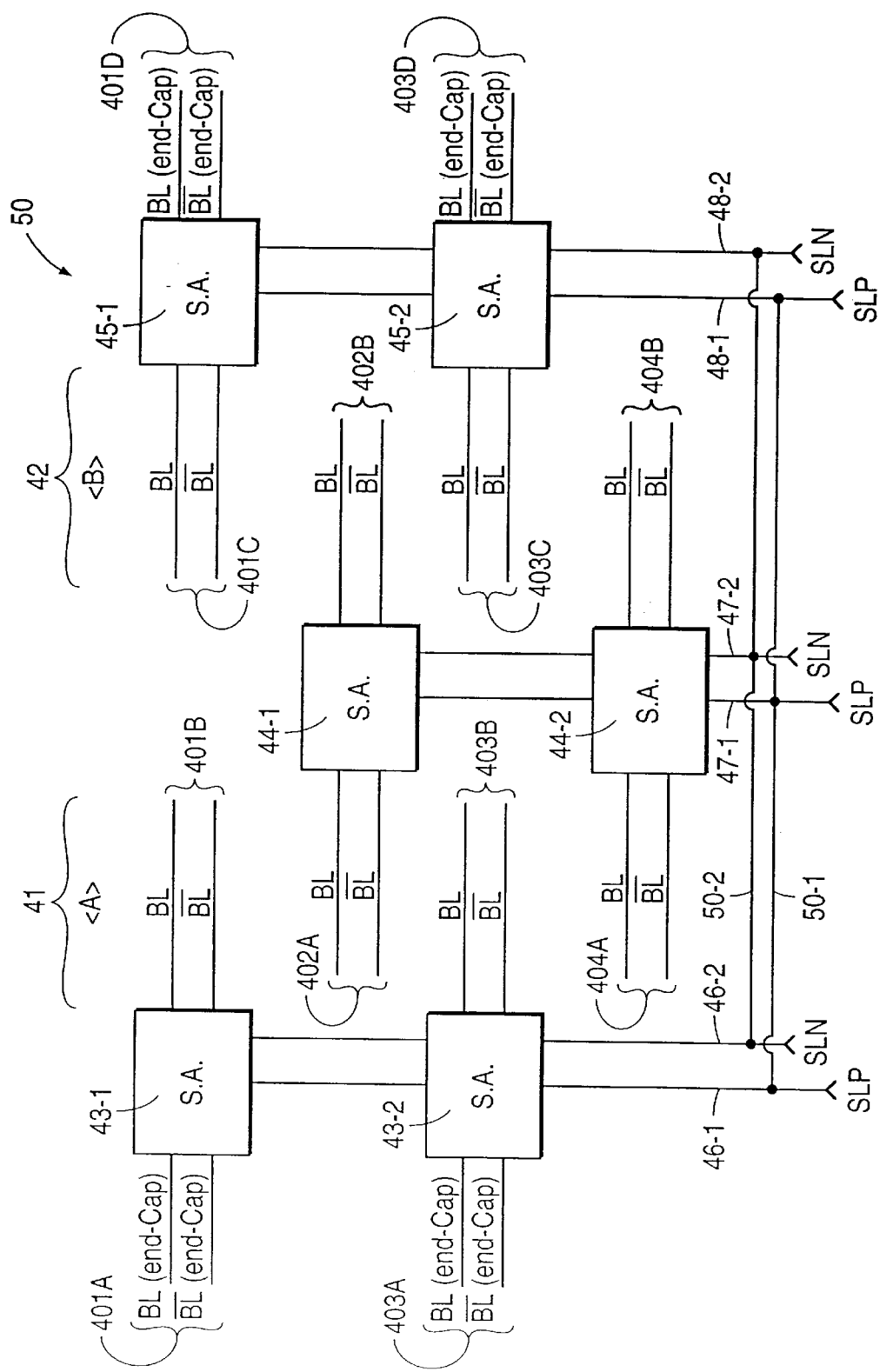
FIG. 5 shows a staggered shared bitline sense amplifier architecture in accordance with this invention, wherein the need for separate address decoders for selectively activating the left edge sense amplifiers 43-1, 43-2, and the right edge sense amplifiers 45-1, 45-2 is eliminated.

Turning to FIG. 5, the structure of FIG. 5 is, at the high level architecture shown, identical to the structure of FIG. 4, except that the address decoding circuitry circuitry implicitly shown in FIG. 4 required to selectively address and activate the edge sense amplifiers 43-1, 43-2, 45-1, and 45-2 is eliminated. Rather, conductive leads 50-1 and 50-2 are provided which interconnect the SLP and SLN voltage lines, respectively, for all sense amplifiers on this circuit, thereby allowing all sense amplifiers to be simultaneously activated. The simultaneous activation of the sense amplifiers in FIG. 5 is made possible by use of the circuitry of FIG. 6 in conjunction with each of the edge sense amplifiers 43-1, 43-2, 45-1, and 45-2 shown in FIG. 5.

While FIG. 5 is intended to illustrate schematically a staggered shared bitline sense amplifier architecture, it should be understood that FIG. 5 represents only a small portion of such a structure. In practice, many more sense amplifiers than shown in FIG. 5 would be provided, but all of these sense amplifiers would work as illustrated in conjunction with the structure shown in FIGS. 5 and 6.

Figure 6:
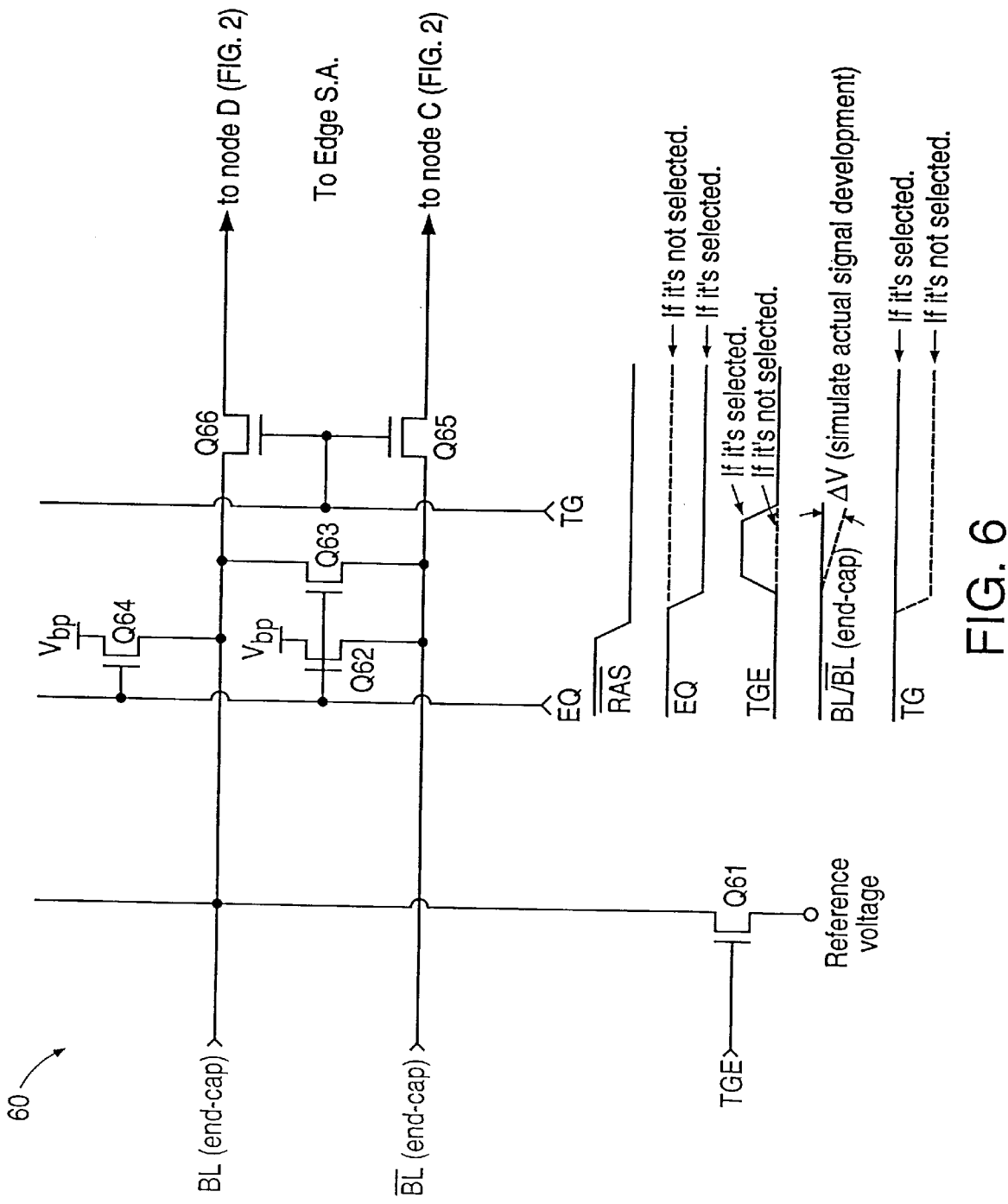
FIG. 6 shows the structure of this invention for generating a dummy signal for application to each edge sense amplifier which makes possible the elimination of the separate address decoding needed for the selective activation of the edge sense amplifiers.

For simplicity, the elements in FIG. 5 are numbered the same as the corresponding elements in FIG. 4, except that array 50 contains the additional circuitry shown in FIG. 6 which eliminates the need for address decoding circuitry associated with activation of the edge sense amplifiers as discussed above.

Each of the edge sense amplifiers 43-1, 43-2, 45-1, and 45-2 shown in FIG. 5 has associated with it a special circuit 60 shown in FIG. 6 which includes an N channel pull down transistor Q61. The N channel pull down transistor Q61 has its source connected to a reference voltage and its drain connected to, as shown in FIG. 6, the bitline BL associated with each of the edge sense amplifiers 43-1, 43-2, 45-1, and 45-2 shown in FIG. 5. While only one bitline BL is shown in FIG. 6 as being connected to pulldown transistor Q61, if the size of Q61 is appropriately selected, Q61 can be connected to a plurality of bitlines BL associated with a plurality of edge sense amplifiers.

Upon receipt of a row address strobe signal RAS, the signal $\overline{RAS}$ goes low thereby activating the read sequence of operations in the memory array. As described above in connection with the prior art, the signal EQ previously has been high to equalize the signals on bitline BL and bitline $\overline{BL}$ by turning on transistors Q62, Q63, and Q64. Transistors Q62 and Q64 apply signal $V_{bp}$ directly to BL and $\overline{BL}$, respectively. Transistor Q63, when turned on, equalizes the voltages on the bitlines BL and $\overline{BL}$. Transistors Q62, Q63 and Q64 can, if desired, be eliminated since the purpose of transistor Q61 is to create a voltage imbalance across nodes C and D of each edge sense amplifier not connected to a memory cell to be read out and transistor Q61 can easily be made large enough to create this imbalance without requiring equalization of the voltages on BL and $\overline{BL}$.

Figure 1:
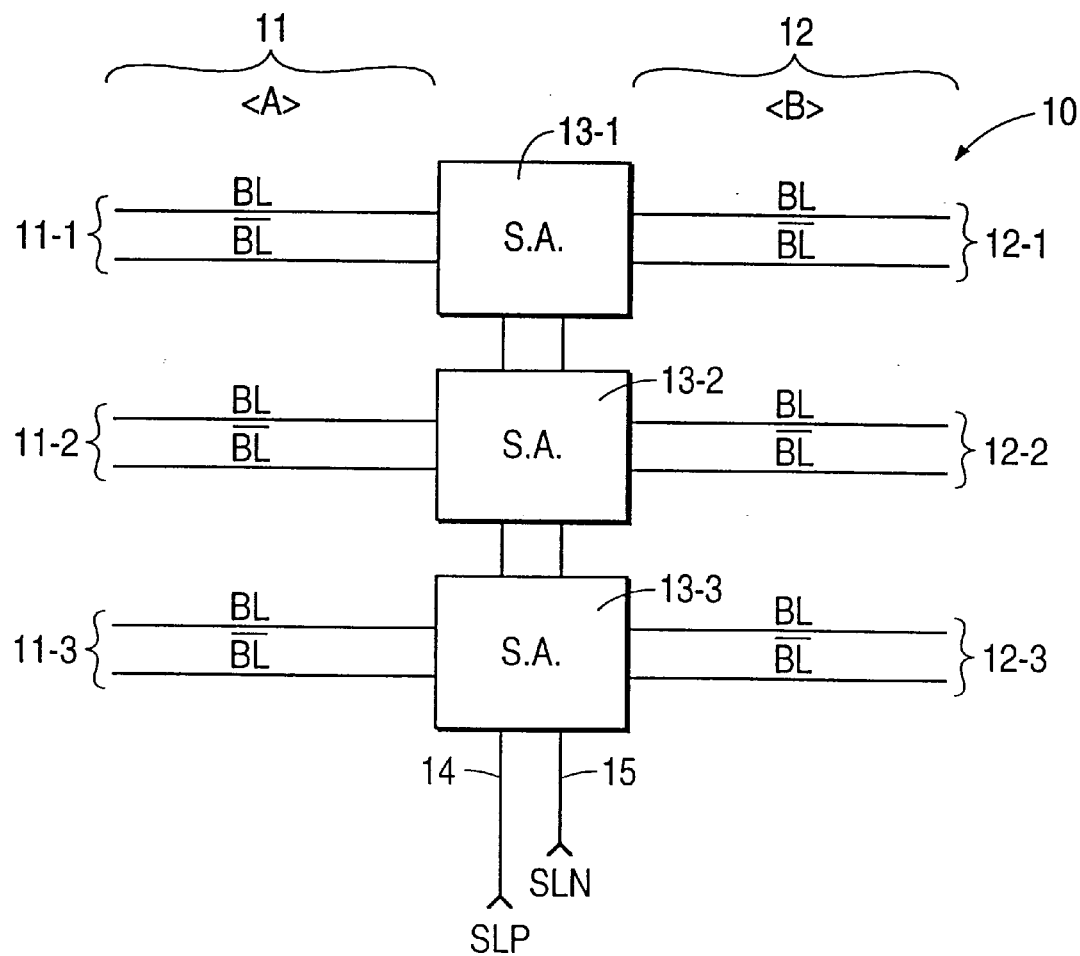
FIG. 1 Illustrates a conventional memory array utilizing a nonstaggered shared bitline sense amplifier architecture with each of the sense amplifiers 13-1, 13-2 and 13-3 being located between the memory blocks 11 and 12.
Figure 2:
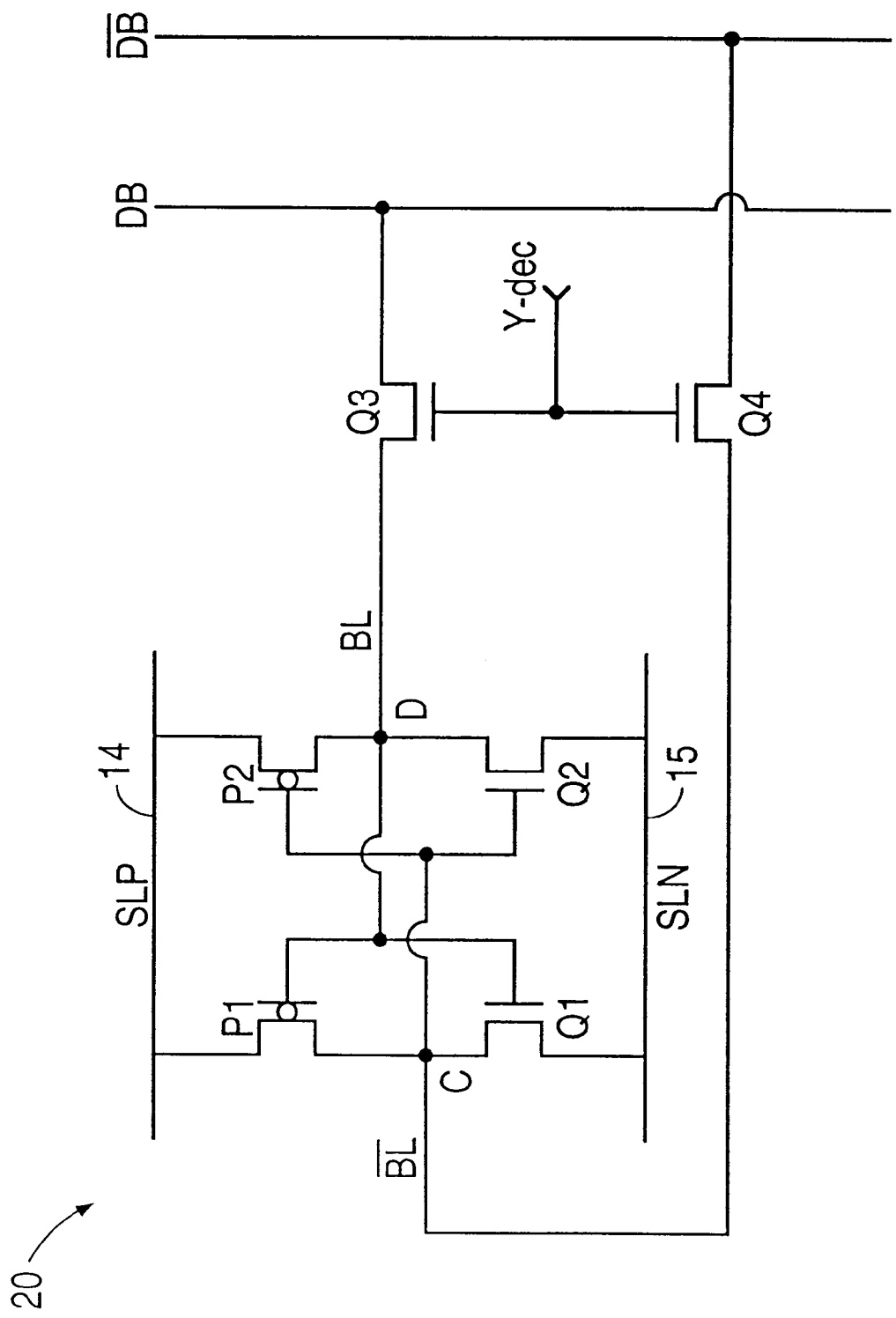
FIG. 2 shows one type of sense amplifier capable of being used in the memory arrays of FIGS. 1, 4.
Figure 3:
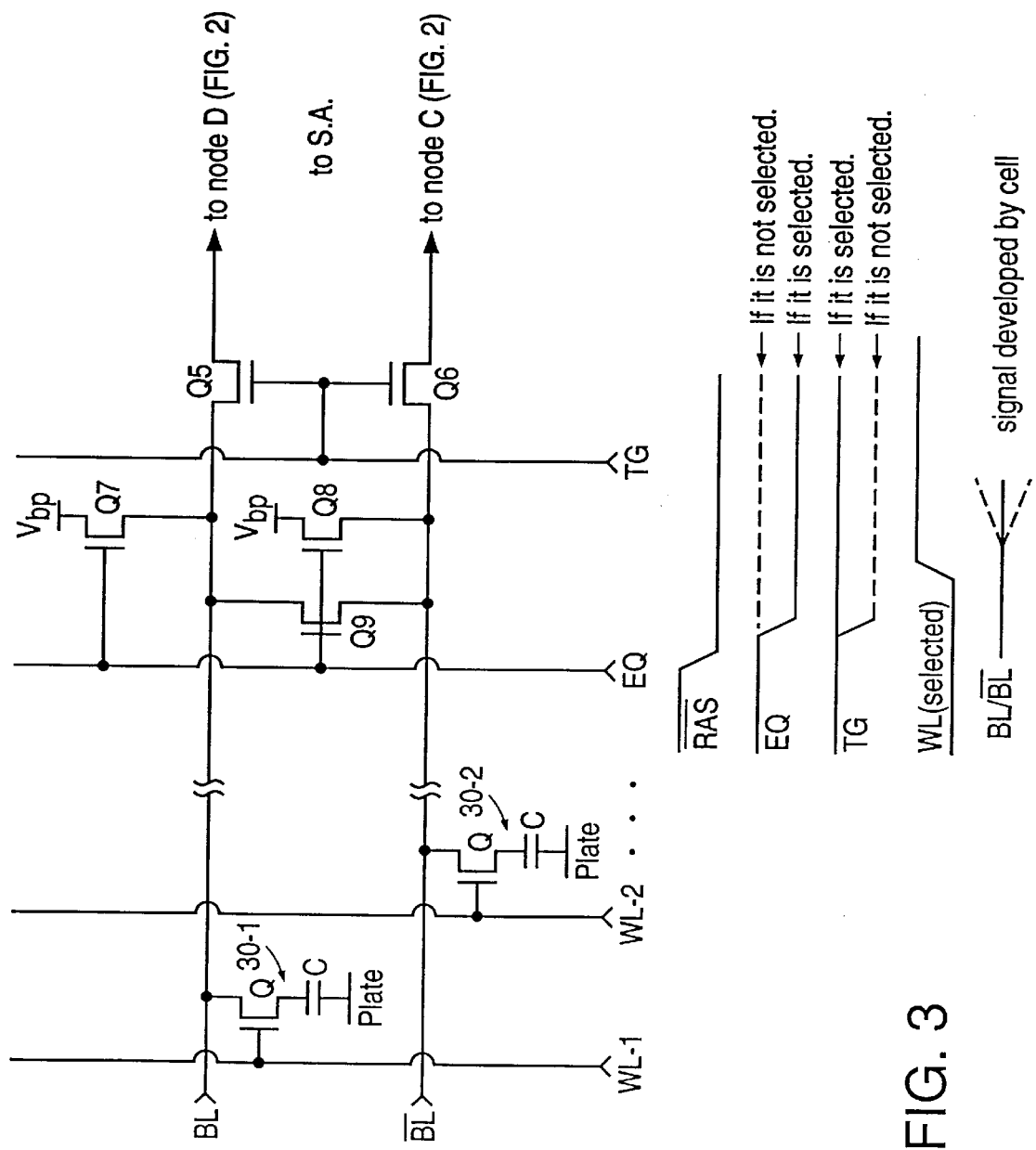
FIG. 3 illustrates the circuitry used to prepare and then read out a memory cell in a memory block of a memory array of the type shown in FIGS. 1, 4, and 5.

If one of the edge sense amplifiers 43-1, 43-2, 45-1, and 45-2 is connected to the memory cell to be read out, then EQ associated with the bit line pair BL and $\overline{BL}$ connected to this edge sense amplifier goes low. This particular edge sense amplifier (see FIG. 2) will, upon its activation, have unequal voltages on its nodes C and D determined by the state of the to-be-read-out memory cell to which bitlines BL and $\overline{BL}$ are connected. This edge sense amplifier will be selected to pass its output signal to the external circuitry. However, the other not-selected edge sense amplifiers will not have their nodes C and D reflect an unbalance corresponding to a signal stored on a memory cell.

The end-cap bitlines associated with the non-selected edge sense amplifiers will also have their signal EQ go low to shut off the corresponding transistors Q62, Q63, and Q64 if these transistors are present and connected to bit lines $\overline{BL}$ (end-cap) and $\overline{BL}$ (end-cap) as shown in FIG. 6. If these transistors are omitted as described above, the transistor Q61 will be sized to create the desired voltage unbalance between nodes C and D without equalization of the voltages on the bitlines BL (end-cap) and $\overline{BL}$ (end-cap). The signal TGE will then be applied to N channel transistor Q61. Transistor Q61 will turn on thereby pulling down the voltages on the bitlines BL (end-cap) to which the drain of transistor Q61 is connected relative to the voltages on the corresponding paired bitlines $\overline{BL}$ (end-cap). This creates an unbalance between the voltages on the lines in each bitline pair BL (end-cap) and $\overline{BL}$ (end-cap) affected by transistor Q61. The duration of the pulse TGE is selected to insure that the voltage difference between BL (end-cap) and $\overline{BL}$ (end-cap) corresponds to the actual signal difference resulting from a memory cell having zero charge being connected to the bitline BL (end-cap) to be read out of the memory array. Thus, after a short period of time, typically about eight (8) nanoseconds, TGE goes low, thereby shutting off transistor Q61. Transistor Q61 in a typical 4 Mbit memory, will have a width to length ratio of 4/1. In practice, the size of Transistor Q61 is selected based on simulation results.

At this time the signal TG associated with all the edge sense amplifiers except the one (if any) selected to be read out of the memory array, remains high, allowing the artificially generated signals on bitlines BL (end-cap) and $\overline{BL}$ (end-cap) to be applied to the corresponding edge sense amplifiers connected to these bitlines BL (end-cap) and $\overline{BL}$. Accordingly, because TG is high, pass transistors Q65 and Q66 are on, and each edge sense amplifier 43-1, 43-2, 45-1, and 45-2 (FIG. 5) connected to a pair of end-cap bitlines such as bitlines BL (end-cap) and $\overline{BL}$ (end-cap) shown in FIG. 6 is activated in the same manner as though a signal corresponding to zero charge from an actual memory cell is being applied to nodes C and D of this sense amplifier. Accordingly, this sense amplifier produces voltages on nodes C and D associated with zero charge stored on a real memory cell. But the voltages on nodes C and D are actually produced by the simulated memory cell capacitor represented by turning on transistor Q61. Thus, the burnout due to "hangup" of each edge sense amplifier so activated is avoided and the special address decoding circuitry necessary in the prior art to activate the edge sense amplifiers 43-1, 43-2, 45-1, and 45-2 is eliminated. Note that leads 50-1 and 50-2 (FIG. 5) interconnect the SLP and SLN leads associated with all of the sense amplifiers in the array, thereby insuring that all sense amplifiers are activated approximately simultaneously.

Of importance, the signal TG associated with the edge sense amplifier connected to the actual memory cell to be read out of the memory array goes low, thereby shutting off the pass transistors Q65 and Q66 associated with the end-cap bitline pair BL (end-cap) and $\overline{BL}$ (end-cap) connectable to this sense amplifier. This prevents the simulated zero charge signal generated by transistor Q61 from affecting this edge sense amplifier. This edge sense amplifier will thus sense the signal on the actual memory cell to be read out of the memory array.

The sense amplifier output signals from the edge sense amplifiers activated by the signals on the end-cap bitline pairs will not be read out of the system. The edge sense amplifiers will be properly restored to their initial states before the next read cycle as though the edge sense amplifiers were internal to the array rather than at the edge of the array. The circuitry of this invention prevents these edge sense amplifiers from being hung up in a neutral state and thereby drawing excessive current and either being damaged or destroyed.

While one embodiment of this invention has been described, other embodiments of this invention will be obvious in view of this description.

What is claimed is:

1. A memory array comprising:

bitline edge sense amplifiers located adjacent the memory array, wherein at least one edge sense amplifier is not selected for connection to an activated memory cell in the memory array during a read cycle; and circuit for generating a signal which causes the at least one edge sense amplifier not selected for connection to an activated memory cell to assume a predetermined state during the read cycle.

2. Structure as in claim 1 wherein the signal simulates a signal generated by an activated memory cell having a selected stored charge.

3. Structure as in claim 1 further comprising sense amplifiers internal to the array, whereby all the edge sense amplifiers and the sense amplifiers internal to the array are activated during the read cycle.

4. Structure as in claim 3 wherein the circuit generates the signal before the activation of all the edge sense amplifiers and the sense amplifiers internal to the array.

5. A method for activating bitline sense amplifiers in a memory device, comprising:

during a read cycle, selecting one or more, but less than all, of a plurality of bitline edge sense amplifiers for connection to one or more activated memory cells in a memory array; and causing at least one edge sense amplifier not selected for connection to an activated memory cell to assume a predetermined state.

6. Method of claim 5 wherein a first signal which simulates a second signal generated by an activated memory cell having a selected stored charge is used to cause the at least one edge sense amplifier not selected for connection to an activated memory cell to assume the predetermined state.

7. Method of claim 5 further comprising activating the plurality of edge sense amplifiers and sense amplifiers internal to the memory array after the causing step.

* * * * *